(12) United States Patent
Tsai et al.

(10) Patent No.: US 9,117,844 B2
(45) Date of Patent: *Aug. 25, 2015

(54) PINCH-OFF CONTROL OF GATE EDGE DISLOCATION

(71) Applicant: TAIWAN SEMICONDUCTOR MANUFACTURING COMPANY, LTD., Hsinchu (TW)

(72) Inventors: Chun Hsiung Tsai, Xinpu Township (TW); Tsan-Chun Wang, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/245,215

(22) Filed: Apr. 4, 2014

(65) Prior Publication Data

US 2014/0220757 A1 Aug. 7, 2014

Related U.S. Application Data

(62) Division of application No. 13/324,257, filed on Dec. 13, 2011, now Pat. No. 8,723,266.

(51) Int. Cl.
*H01L 21/336* (2006.01)
*H01L 21/8234* (2006.01)
*H01L 29/66* (2006.01)
(Continued)

(52) U.S. Cl.
CPC ........ *H01L 29/66636* (2013.01); *H01L 21/268* (2013.01); *H01L 21/26506* (2013.01); *H01L 21/324* (2013.01); *H01L 21/823412* (2013.01); *H01L 21/823425* (2013.01); *H01L 21/823807* (2013.01); *H01L 21/823814* (2013.01); *H01L 29/32* (2013.01); *H01L 29/6659* (2013.01); *H01L 29/7834* (2013.01);
(Continued)

(58) Field of Classification Search
CPC ............ H01L 21/8228; H01L 21/8232; H01L 21/8238; H01L 21/823814; H01L 29/49; H01L 29/94; H01L 29/7842
USPC .......................... 438/197, 198, 199, 301, 303; 257/E21.632
See application file for complete search history.

(56) References Cited

U.S. PATENT DOCUMENTS 7,847,321 B2 12/2010 Hara
7,928,427 B1 4/2011 Chang
(Continued)

OTHER PUBLICATIONS

Lim, Kwan-Young et al., "Novel-Stress Memorization-Technology (SMT) for High Electron Mobility Enhancement of Gate Last High-k/Metal Gate Devices", IEEE 2010, pp. 10.1.1-10.1.4.
(Continued)

*Primary Examiner* — Hoai V Pham
(74) *Attorney, Agent, or Firm* — Lowe Hauptman & Ham, LLP

(57) ABSTRACT

A method of manufacturing a semiconductor device includes providing a substrate having a gate stack, and performing a pre-amorphous implantation (PAI) process to form an amorphized region on the substrate. The method also includes performing an annealing process to recrystallize the amorphized region after the stress film is formed. The annealing process includes a preheat at a temperature in a range from about 400° C. to about 550° C. and an annealing temperature equal to or greater than about 900° C., and the annealing process recrystallizes the amorphized region.

20 Claims, 14 Drawing Sheets

(51) Int. Cl.
*H01L 21/8238* (2006.01)
*H01L 29/32* (2006.01)
*H01L 29/78* (2006.01)
*H01L 21/265* (2006.01)
*H01L 21/268* (2006.01)
*H01L 21/324* (2006.01)

(52) U.S. Cl.
CPC ....... *H01L 29/7847* (2013.01); *H01L 29/7848* (2013.01); *H01L 29/6653* (2013.01)

(56) References Cited

U.S. PATENT DOCUMENTS

| | | |
|---|---|---|
| 2005/0095799 A1 | 5/2005 | Wang et al. |
| 2006/0228842 A1 | 10/2006 | Zhang et al. |
| 2006/0234504 A1 | 10/2006 | Bauer et al. |
| 2010/0025779 A1 | 2/2010 | Kammler et al. |
| 2010/0148270 A1 | 6/2010 | Golonzka et al. |
| 2011/0027956 A1 | 2/2011 | Domenicucci et al. |
| 2011/0068403 A1 | 3/2011 | Hattendorf et al. |
| 2012/0104498 A1 | 5/2012 | Majumdar et al. |
| 2013/0009216 A1* | 1/2013 | Tsai et al. ............. 257/288 |
| 2013/0099314 A1 | 4/2013 | Lu et al. |

OTHER PUBLICATIONS

Fischer, P. R. et al., "Low Temperature Silcore Deposition of Undoped and Doped Silicon Films", ECS Transactions, 3 (2) 203-215 (2006).

* cited by examiner

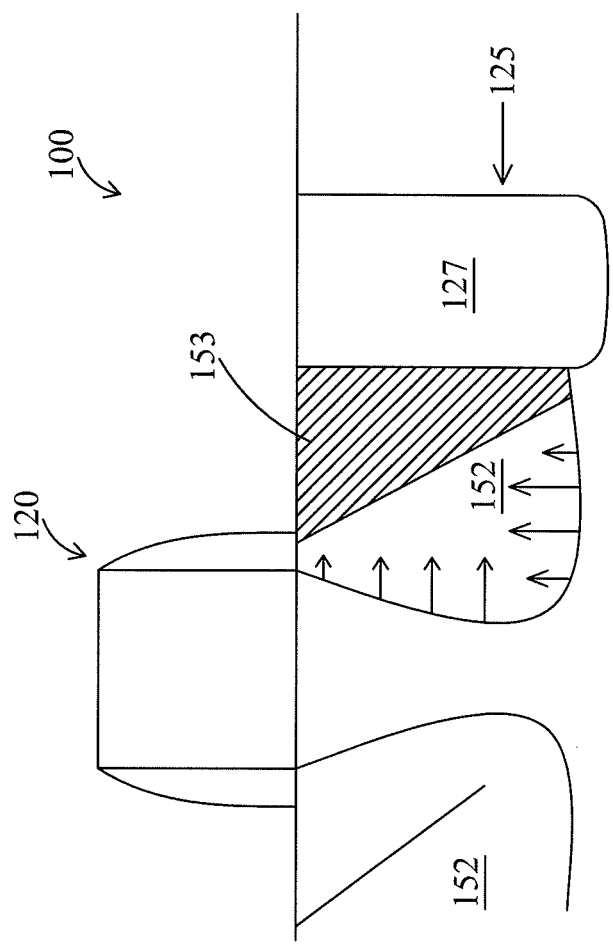

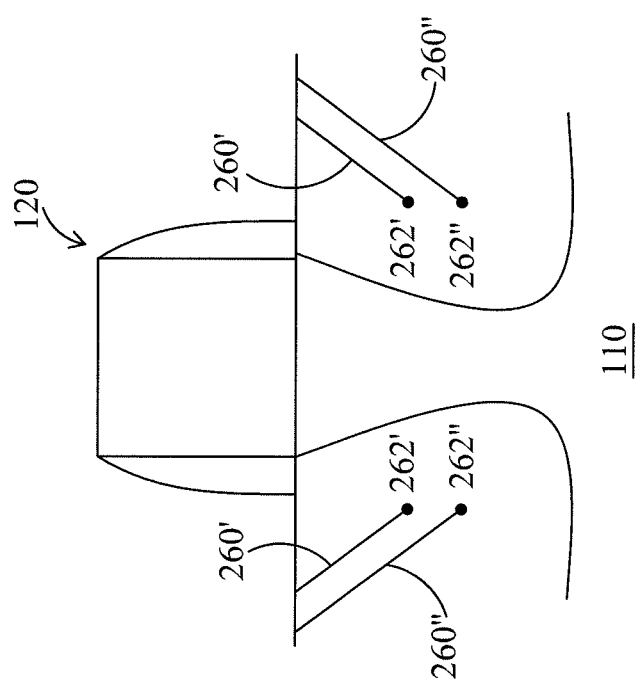

PINCH-OFF CONTROL OF GATE EDGE DISLOCATION

PRIORITY CLAIM

The present application is a divisional of U.S. application Ser. No. 13/324,257, filed Dec. 13, 2011, which is incorporated herein by reference in its entirety.

RELATED APPLICATIONS

The present application is related to U.S. Pat. No. 8,629,046, filed Jul. 6, 2011, and U.S. application Ser. No. 13/029,378, filed Feb. 17, 2011, both of which are incorporated herein by reference in their entireties. The present application is also related to U.S. Pat. No. 8,674,453, entitled "Mechanisms for Forming Stressor Regions of a Semiconductor Device", which is also incorporated herein by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as semiconductor devices, such as a metal-oxide-semiconductor field-effect transistors (MOSFETs), are scaled down through various technology nodes, strained source/drain features (e.g., stressor regions) have been implemented to enhance carrier mobility and improve device performance. Stress distorts or strains the semiconductor crystal lattice, which affects the band alignment and charge transport properties of the semiconductor. By controlling the magnitude and distribution of stress in a finished device, manufacturers can increase carrier mobility and improve device performance. Although existing approaches to forming stressor regions for IC devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A shows a gate structure next to an isolation structure on a substrate, in accordance with some embodiments.

FIG. 2C shows dislocations with different pinchoff points for different annealing processes, in accordance with some embodiments.

DETAILED DESCRIPTION

Figure 1:
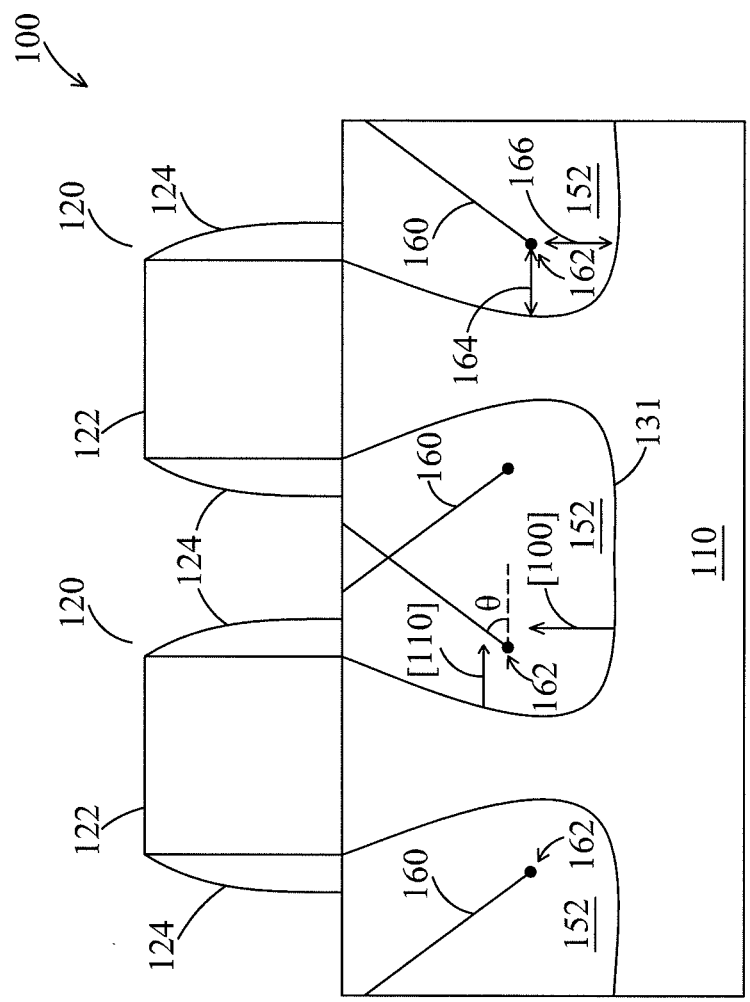
FIG. 1 shows a semiconductor device 100, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is understood that those skilled in the art will be able to devise various equivalents that, although not explicitly described herein, embody the principles of the present invention.

Examples of devices that can benefit from one or more embodiments of the present invention are semiconductor devices with field effect transistors (FET). Such a device, for example, is a complementary metal-oxide-semiconductor (CMOS) field effect transistor. The following disclosure will continue with this example to illustrate various embodiments of the present invention. It is understood, however, that the invention should not be limited to a particular type of device, except as specifically claimed.

FIG. 1 shows a semiconductor device 100, in accordance with some embodiments. Device 200 includes a substrate 110, which includes a source region and a drain region (not shown) on both sides of each gate structure 120. A channel region (not shown) exists between the source region and the drain region. The gate structure 120 includes a gate stack 122. In some embodiments, the gate stack 122 includes one or more gate dielectric layer and a gate electrode. In some embodiments, the gate structure 120 also includes gate spacers 124 disposed on sidewalls of the gate stack 122. FIG. 1 also shows that semiconductor device 100 includes stressor regions 152, which are recrystallized from an amorphized phase, having dislocations 160. The dislocations 160 exert stress, which enhances carrier mobility, in the stressor regions 152.

The dislocations 160 start formation at pinchoff points 162. The recrystallization first occurs at the crystalline/amorphized-region interface, which is demonstrated by curve 131. In some embodiments, the dislocations 160 are formed at the interface of crystalline growth at the [100] direction from the bottom interface of curve 131 and the crystalline growth at the [110] direction from the side interface of curve 131, as shown in FIG. 1. The dislocation 160 is in the [111] direction, in accordance with some embodiments. The [111] direction has an angle, θ, in a range from about 45 to about 65 degrees, the angle being measured with respect to an axis parallel to a surface of the substrate 110.

The pinchoff points 162 have a horizontal buffer 164 and a vertical buffer 166. The horizontal buffer 164 and the vertical buffer 166 are formed according to design specifications and are affected by an annealing process used to recrystallize the stressor regions 152. The pinchoff points 162 have a horizontal buffer 164 of about 5 to about 20 nanometers and a vertical buffer 166 of about 10 to about 40 nanometers, in some embodiments. In some embodiments, the pinchoff points 162 are formed such that they are not disposed within the channel region. Details of forming dislocations 160 and stressor regions 152 will be described later.

FIG. 2A shows a gate structure 120 next to an isolation structure 125 on substrate 110, in accordance with some embodiments. The gate structure and the isolation structure 125 are also part of the semiconductor device 100. The isolation structure 125 includes an opening 127 filled with a dielectric material, such as silicon oxide. In some embodiments, the isolation structure 125 also includes a dielectric liner (not shown). In some embodiments, the isolation structure 125 is a shallow trench isolation. As described above, dislocations in the stressor regions, such as regions 152 of FIG. 1, are formed during the recrystallization of stressor regions 152, which were amorphized prior to recrystallization. The recrystallization starts at the interface between the amorphized regions, such as regions 152, and the silicon substrate 110. Due to the neighboring isolation structure 125, region 153 of region 152' would be recrystallized with a significant amount of un-desired dislocations, since silicon crystalline structure cannot be formed properly on the dielectric-filled isolation structure 125. In addition to forming un-desired dislocation, the isolation structure 125 may also interfere with the formation of dislocation(s) in region 152'. The dislocations 160 are formed when the recrystallized [100] crystalline orientation of bottom portion of the regions 152 (recrystallized) meets the [110] crystalline orientation of side portion of regions 152. As mentioned above, the dislocations start at pinchoff points. The presence of the non-crystalline and oxide-filled isolation structure 125 could affect the formation of pinchoff points, since recrystallization at the bottom interface (100 direction) near isolation structure 125 is limited by the presence of isolation structure 125. As a result, the formation of dislocation in region 152' might not occur.

The lack of formation of dislocation(s) 160 in region 152', which is a source or drain region of a transistor involving gate structure 120, could degrade the performance of the transistor. Therefore, there is a need to seek ways to form dislocations in a recrystallized region 152' next to the isolation structure 125.

As described above, the dislocations 160 are formed during an annealing operation used to recrystallize amorphized regions into regions 152. The annealing process can affect the initiation, or formation of pinchoff points 162, and growth of dislocations 160.

In some embodiments, the annealing process includes a pre-heat operation which minimizes or even eliminates end of range (EOR) defects, which are the remained defects at the amorphous/crystalline interface. The pre-heat operation is performed at a temperature from about 200° C. to about 700° C., in accordance with some embodiments. The pre-heat operation is performed in a range from about 10 seconds to about 10 minutes, in some embodiments.

In some embodiments, the annealing process is a thermal annealing process that raises a temperature of the substrate 110 rapidly. For example, the thermal annealing may include, but is not limited to, spike anneal, millisecond anneal (MSA), microsecond anneal (μSA), etc. Spike anneal, also termed rapid thermal anneal (RTA), uses heating lamps, such as tungsten-halogen lamps, to quickly raise the temperature of the substrate. In some embodiments, the temperature ramp rate is in a range from about 50° C./sec to about 300° C./sec.

Figure 2B:
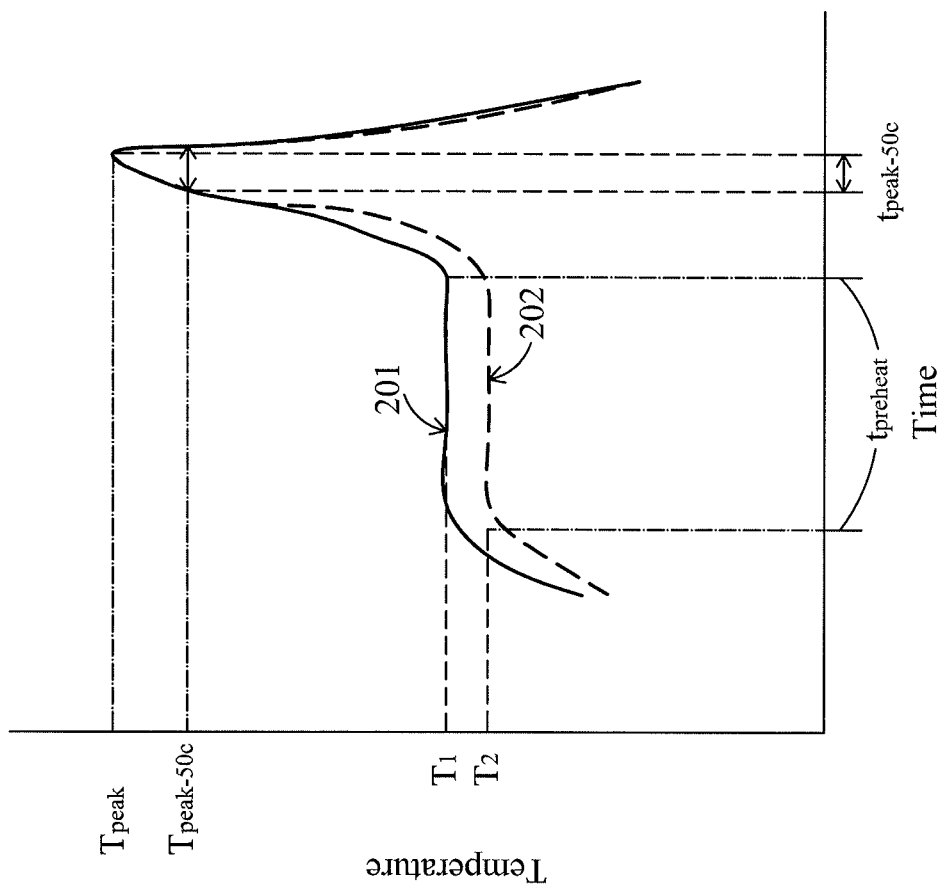
FIG. 2B shows annealing curves for two annealing processes used to recrystallize amorphized regions to form recrystallized regions, in accordance with some embodiments.

FIG. 2B shows annealing curves for two annealing processes used to recrystallize amorphized regions to form recrystallized regions, such as 152 and 152' both in FIG. 1 and FIG. 2A, in accordance with some embodiments. The annealing process is spike anneal. One of the annealing processes preheats substrate 110 to a temperature $T_1$ for a duration $t_{preheat}$ and then ramps up the temperature to an annealing peak temperature $T_{peak}$. The substrate is then cooled down. The duration of the annealing at $T_{peak}$ is represented by $t_{peak-50C}$, which is the duration between heating to $T_{peak-50C}$ (peak temperature minus 50° C.) and cooling to $T_{peak-50C}$, as shown in FIG. 2B. The annealing temperature profile is represented by curve 201. In some embodiments, $T_1$ is in a range from about 300° C. to about 750° C., and $t_{preheat}$ is in a range from about 1 second to about 120 seconds, in some embodiments. The peak annealing temperature, $T_{peak}$, is equal to or greater than about 900° C., and $t_{peak-50C}$ is in a range from about 0.5 second to about 5 seconds.

FIG. 2B also shows another annealing process, represented by annealing curve 202. This annealing process (with annealing curve 202) has a preheat temperature, $T_2$, lower than $T_1$. Studies show that a lower preheat temperature would allow the occurrence of the pinchoff point 262', shown in FIG. 2C, at a lower location, i.e., further from a surface of the substrate 110. FIG. 2C shows a dislocation 260' with a pinchoff point 262', which is formed by using an annealing process with a preheat temperature $T_1$ and follows the annealing curve 201, in accordance with some embodiments. FIG. 2C also shows a dislocation 260" with a pinchoff point 262" formed by using the other annealing process with annealing curve 202 and a lower preheat temperature $T_2$. Pinchoff point 262" is lower (from the substrate surface) than pinchoff point 262'. Although FIG. 2C shows two separate dislocations 260' and 260", in some embodiments 260' and 260" overlap each other, with the difference that 262" starts at lower position than 262'. By forming the pinchoff point(s) 262" at a lower temperature allows the formation of dislocations 260" even in source and/or drain regions next to an isolation structures, such as region 252' of FIG. 2A. In some embodiments, the preheat temperature is in a range from about 200° C. to about 700° C.

In addition to rapid thermal annealing (RTA), which is also be called as spike anneal, other types of annealing process may also be used to achieve the annealing purposed described above. For example, in some embodiments, a millisecond anneal (MSA) is used to anneal the amorphized regions and to from dislocations in the regions. In some embodiments, MSA uses Xe/Ar lamps to achieve a rapid ramp of substrate temperature to reach the anneal temperature. In some embodiments, the temperature ramp rate is in a range from about 100,000° C./sec to about 1,000,000° C./sec.

Figure 2D:
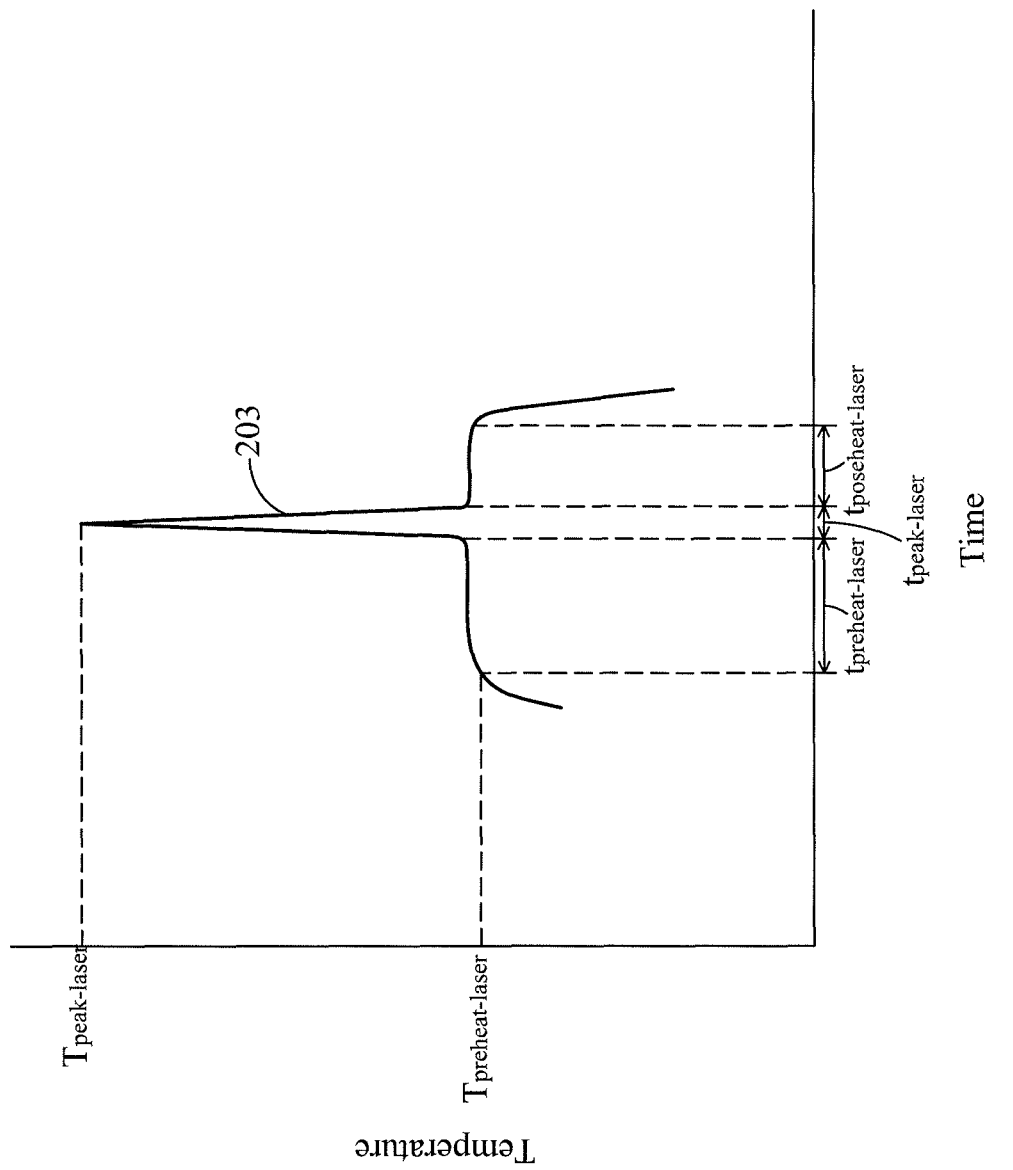
FIGS. 2D and 2E show temperature diagrams of two separate annealing processes, in accordance with some embodiments.

FIG. 2D shows a temperature diagram of an MSA, in accordance with some embodiments. The annealing temperature profile is represented by curve 203. The MSA may also be called laser anneal. In some embodiments, the annealing process includes a preheat at a temperature, $T_{preheat-laser}$, for a duration of $t_{preheat-laser}$. After the substrate 110 is preheated, the substrate temperature is quickly ramped to the peak annealing temperature $T_{peak-laser}$. The substrate 110 is annealed at the peak temperature for a duration of $t_{peak-laser}$, which is in the range of milliseconds, such as in a range from about 1 millisecond to about 100 milliseconds. After annealing, the heating process used to perform the preheat is maintained for another duration of $t_{postheat-laser}$ to maintain the substrate temperature during and immediately after the MSA, in accordance with some embodiments. By controlling the preheat temperature, the locations of the pinchoff points and dislocations are controlled. In some embodiments, $T_{preheat-laser}$ is in a range from about 400° C. to about 800° C., and $t_{preheat}$ is in a range from about 0.5 second to about 10 seconds, in some embodiments. In some embodiments, the peak annealing temperature, $T_{peak-laser}$, is equal to or greater than about 1000° C., and $t_{peak-laser}$ is in a range from about 1 millisecond to about 20 milliseconds. Since the MSA has a shorter duration than spike anneal (or RTA), a higher peak temperature is expected.

In addition to RTA and millisecond anneals, other types of thermal anneal may also be used. Another example of thermal anneal is microsecond anneal (or μSA), in which a substrate temperature is quickly raised from about 400-500° C. to about 1000° C. in microseconds. In some embodiments, μSA uses diode laser or $CO_2$ laser to achieve a rapid ramp of substrate temperature to reach the anneal temperature. In some embodiments, the temperature ramp rate is in a range from about 1,000,000° C./sec to about 100,000,000° C./sec.

Figure 2E:
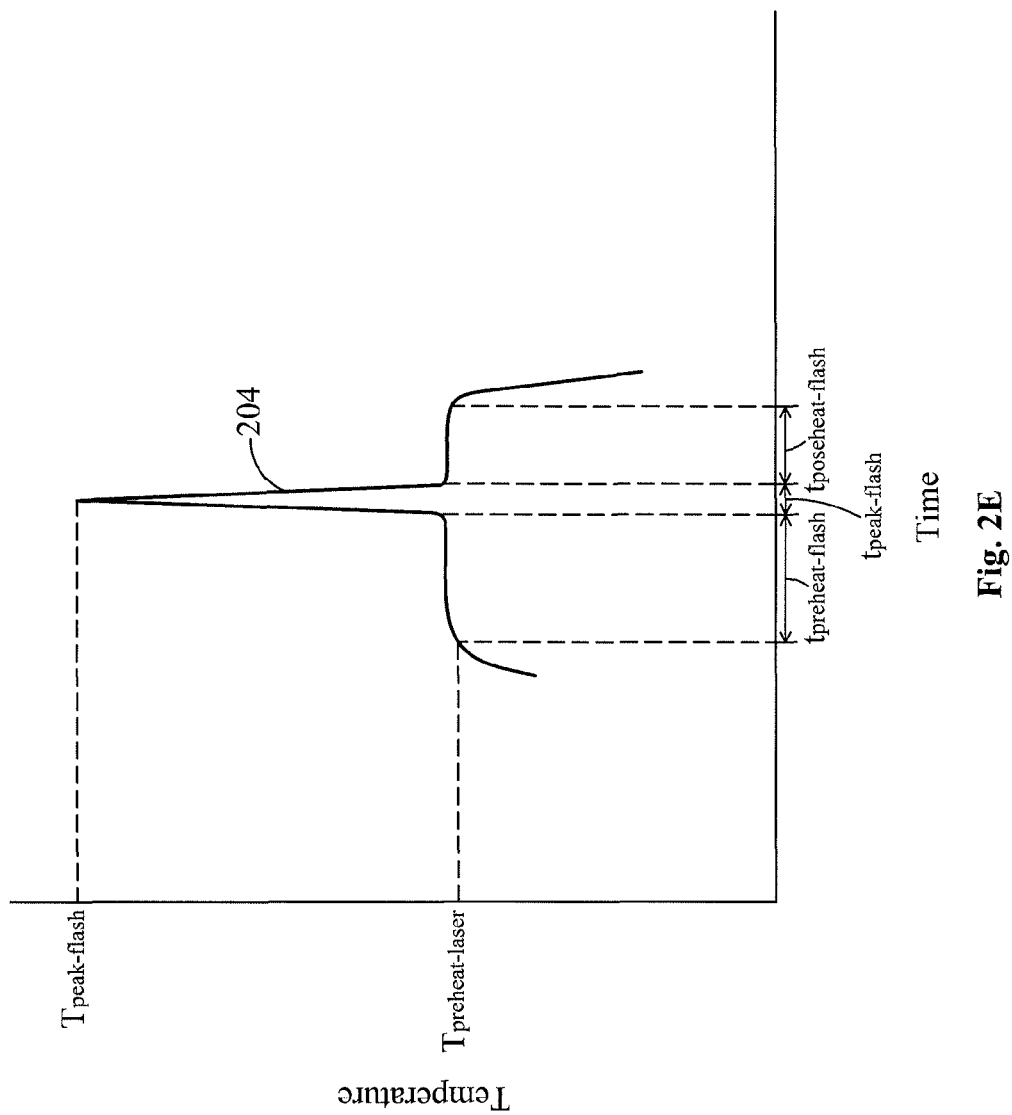

FIG. 2E shows a temperature diagram of a μSA, in accordance with some embodiments. The annealing temperature profile is represented by curve 204. In some embodiments, the microsecond anneal, which is also be called flash anneal, includes a preheat at a temperature, $T_{preheat-flash}$, for a duration of $t_{preheat-flash}$. After the substrate 110 is preheated, the substrate temperature is quickly ramped to the peak annealing temperature $T_{peak-flash}$. The substrate is annealed at the peak temperature for a duration of $t_{peak-flash}$, which is in the range of microseconds (μs), such as in a range from about 1 μs to about 100 μs. After annealing, the heating process used to perform the preheat is maintained for another duration of $t_{postheat-flash}$ to maintain the substrate temperature during and immediately after the μSA, in accordance with some embodiments. As mentioned above, the locations of the pinchoff points and dislocations are controlled by preheat temperature. In some embodiments, $T_{preheat-flash}$ is in a range from about 400° C. to about 800° C., and $t_{preheat}$ is from in a range from about 0.5 second to about 10 seconds, in some embodiments. In some embodiments, the peak annealing temperature, $T_{peak-flash}$, is equal to or greater than about 1100° C., and $t_{peak-flash}$ is in a range from about 1 microsecond to about 500 microseconds. Since the μSA has a shorter duration than RTA and MSA, a higher peak temperature than RTA and MSA is expected.

With reference to FIGS. 3 and 4-10, a method 170 and a semiconductor device 200 are collectively described below. The semiconductor device 200 illustrates an integrated circuit, or portion thereof, that comprises active devices such as metal-oxide-semiconductor field effect transistors (MOSFETs), complementary metal-oxide-semiconductor (CMOS) transistors, high voltage transistors, and/or high frequency transistors; other suitable components; and/or combinations thereof. The semiconductor device 200 may additionally include passive components, such as resistors, capacitors, inductors, and/or fuses. It is understood that the semiconductor device 200 may be formed by CMOS technology processing, and thus some processes are not described in detail herein. Additional operations can be provided before, during, and after the method 100, and some of the operations described below can be replaced or eliminated, for additional embodiments of the method. It is further understood that additional features can be added in the semiconductor device 200, and some of the features described below can be replaced or eliminated, for additional embodiments of the semiconductor device 200.

Figure 3:
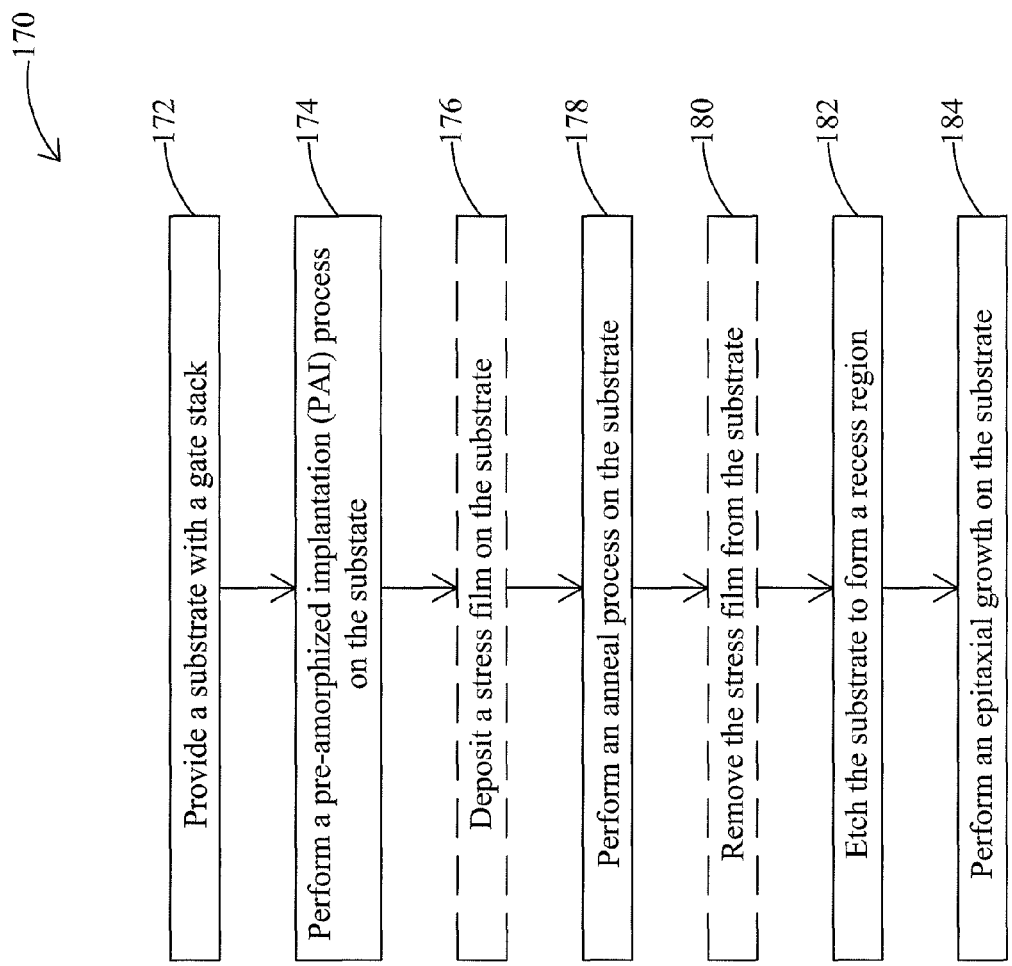
FIG. 3 is a flowchart illustrating a method of forming a semiconductor device according to various aspects of the present disclosure.

Referring to FIG. 3, the method 170 for fabricating the semiconductor device 200 is described according to various aspects of the present disclosure. The method 170 begins with operation 172, in which a substrate is provided. The substrate includes a gate structure with a gate stack. The method 170 continues with operation 174 in which a pre-amorphous implantation (PAI) process is performed on the substrate. The method 170 continues at operation 176 in which an optional stress film is deposited on the substrate. The method 170 continues at operation 178 in which an anneal process is performed on the substrate. The method 170 continues at operation 180 in which the stress film is removed. However, if the stress film is not deposited, operation 180 is not needed. In some embodiments, the formation of the strain regions is completed at operation 180 or operation 178 if the stress film was not deposited. In some embodiments, recess regions are formed in the strain regions as described below.

In some embodiments, the method 170 continues at operation 182 in which a recess region is formed on the substrate. The method 170 continues at operation 184 in which an epitaxial growth is performed on the substrate. The discussion that follows illustrates various embodiments of a semiconductor device 200 fabricated according to the method 170 of FIG. 3.

Figure 4:
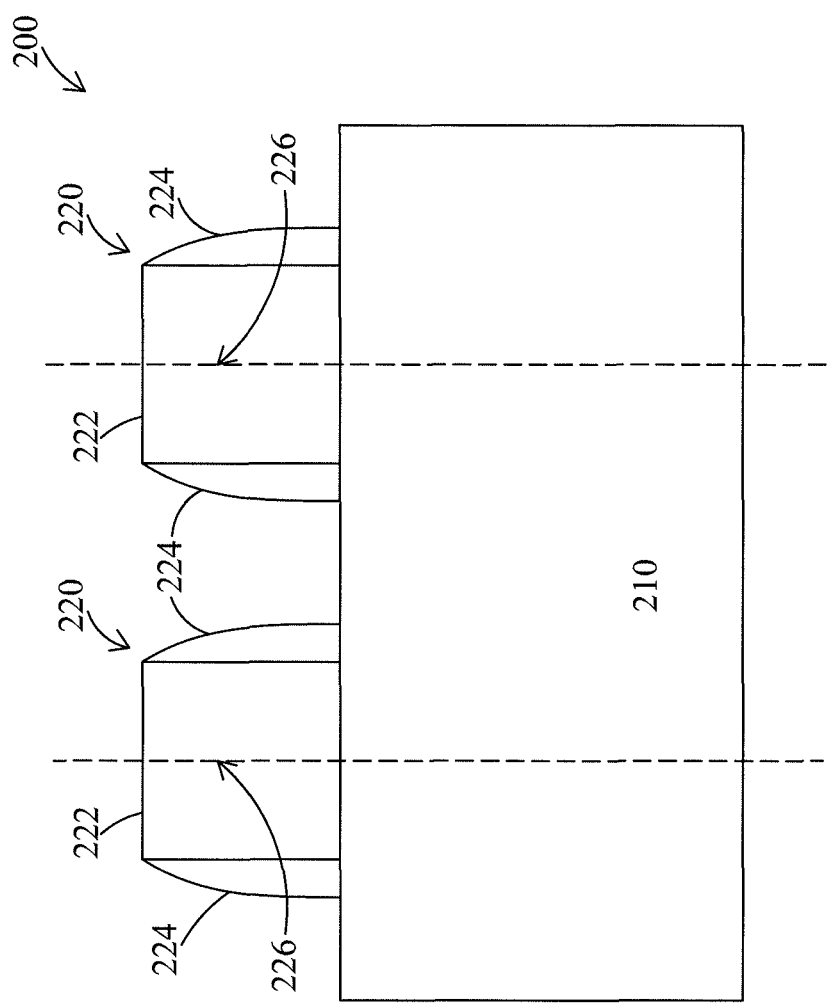
FIGS. 4 to 10 illustrate diagrammatic cross-sectional side views of one embodiment of a semiconductor device at various stages of fabrication according to the method of FIG. 3.

FIGS. 4 to 10 illustrate diagrammatic cross-sectional side views of one embodiment of a semiconductor device 200 at various stages of fabrication according to the method 170 of FIG. 1. Referring to FIG. 4, the semiconductor device 200 includes a substrate 210. In the present embodiment, the substrate 210 is a semiconductor substrate including silicon. Alternatively, the substrate 210 includes an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, where the substrate 210 is an alloy semiconductor, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate, and/or the SiGe substrate is strained. In yet another alternative, the semiconductor substrate is a semiconductor on insulator (SOI).

The substrate 210 includes various doped regions depending on design requirements as known in the art (e.g., p-type wells or n-type wells). The doped regions are doped with p-type dopants, such as boron or $BF_2$, and/or n-type dopants, such as phosphorus or arsenic. In some embodiments, the doped regions are formed directly on the substrate 210, in a P-well structure, in an N-well structure, in a dual-well structure, or using a raised structure. The doped regions include various active regions, such as regions configured for an N-type metal-oxide-semiconductor transistor (referred to as an NMOS) and regions configured for a P-type metal-oxide-semiconductor transistor (referred to as a PMOS).

In some embodiments, the substrate 210 includes an isolation region to define and isolate various active regions of the substrate 210. The isolation region utilizes isolation technology, such as shallow trench isolation (STI) or local oxidation of silicon (LOCOS), to define and electrically isolate the various regions. The isolation region includes silicon oxide, silicon nitride, silicon oxynitride, other suitable materials, or combinations thereof.

With further reference to FIG. 4, the substrate 210 includes gate structures 220 disposed over channel regions. In some embodiments, the substrate 210 further includes a source region and a drain region on both sides of one of the gate structures 220, the channel region being the region between the source region and the drain region. In some embodiments, lightly-doped drains (LDDs) are formed in substrate 210. Portions of the LDDs may be formed under the gate structures 220. For NMOS transistors, N-type lightly-doped drains (LDDs) are formed of n-type dopants, such as phosphorous, arsenic, and/or other group V elements. In some embodiments, P-type pocket doped regions are also formed in substrate 210.

The gate structure 220 includes various gate material layers. In the present embodiment, the gate structure 220 includes a gate stack 222, which includes one or more gate dielectric layer and a gate electrode. The gate structure 220 also includes gate spacers 224 disposed on sidewalls of the gate stack 222. The gate structure 220 is divided into two substantially equal halves by an imaginary center line 226.

The gate stack 222 is formed over the substrate 210 to a suitable thickness. In an example, the gate stack 222 includes a polycrystalline silicon (or polysilicon) layer. In some embodiments, the polysilicon layer is doped for proper conductivity. Alternatively, the polysilicon is not necessarily doped, for example, if a dummy gate is to be formed and later replaced by a gate replacement process. In another example, the gate stack 222 includes a conductive layer having a proper work function, therefore, the gate stack 222 is also referred to as a work function layer. The work function layer includes a suitable material, such that the layer can be tuned to have a proper work function for enhanced performance of the device. For example, if an N-type work function metal (N-metal) for an NMOS device is desired, Ta, TiAl, TiAlN, or TaCN, is used. In some embodiments, the work function layer includes doped conducting oxide materials. In some embodiments, the gate stack 222 includes other conductive materials, such as aluminum, copper, tungsten, metal alloys, metal silicide, other suitable materials, and/or combinations thereof. In some embodiments, the gate stack 222 includes multiple layers. For example, where the gate stack 222 includes a work function layer, another conductive layer can be formed over the work function layer. In some embodiments, the gate stack 222 is formed by chemical vapor deposition (CVD), physical vapor deposition (PVD), atomic layer deposition (ALD), high density plasma CVD (HDPCVD), plating, other suitable methods, and/or combinations thereof.

The gate spacers 224 are formed over the substrate 210 by any suitable process to any suitable thickness. The gate spacers 224 include a dielectric material, such as silicon nitride, silicon oxide, silicon oxynitride, other suitable materials, and/or combinations thereof. In some embodiments, the gate spacers 224 are used to offset subsequently formed doped regions, such as heavily doped source/drain regions.

Figure 5:
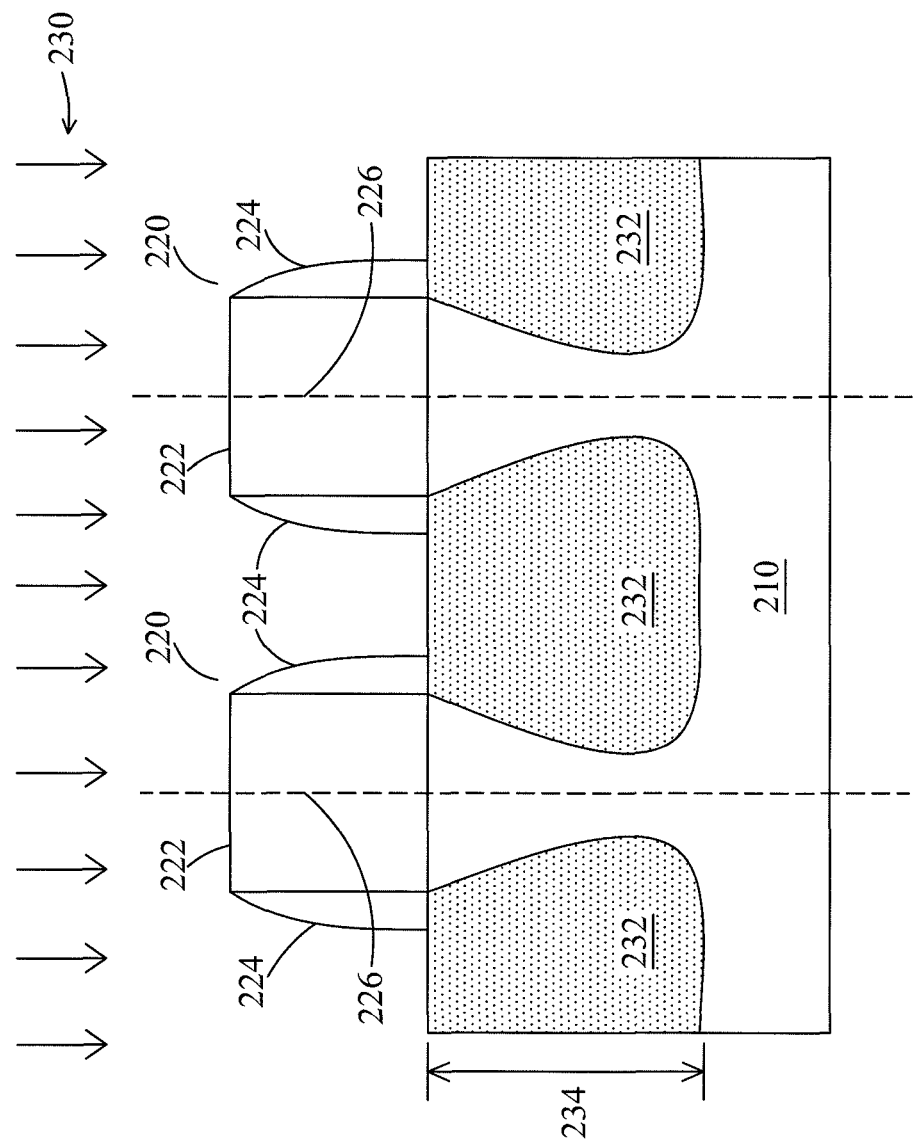

Referring to FIG. 5, a pre-amorphous implantation (PAI) process 230 is performed on the substrate 210. The PAI process 230 implants the substrate 210 with some species. The implanted species damage the lattice structure of the substrate 210 and form an amorphized region 232. In some embodiments, the implanted ions scatter in substrate 210. The scattered ions caused lateral amorphization, which results in amorphized region 232 extending to regions shadowed by spacers 224. In some embodiments, the amorphized region 232 is formed in a source and drain region of the semiconductor device 200 and does not extend beyond the center line 226 of the gate structure 220. The amorphized region 232 has a depth 234. The amorphized depth 234 is formed according to design specifications. In some embodiments, the amorphized depth 234 is in a range from about 10 to about 150 nanometers. In some embodiments, the amorphized depth 234 is less than about 100 nanometers.

The amorphized depth 234 is controlled by the thickness of the gate spacers 224, because the gate spacers 224 serve to concentrate the PAI process 230 implantation energy away from the center line 226 of the gate structure 220, thereby allowing for a deeper amorphized depth 234. In addition, the amorphized depth 234 is controlled by parameters of the PAI process 230, such as implant energy, implant species, and implant dosage, etc. The PAI process 230 implants the substrate 210 with silicon (Si) or germanium (Ge), in accordance with some embodiments. In some embodiments, other implant ions heavier than Si are used. For example, in some embodiments, the PAI process 230 utilizes other implant species, such as Ar, Xe, $BF_2$, As, In, other suitable implant species, or combinations thereof. Alternatively, the PAI process 230 utilizes other implant species, such as Ar, Xe, $BF_2$, As, In, other suitable implant species, or combinations thereof. In some embodiments, the PAI process 230 implants species at an implant energy in a range from about 20 KeV to about 60 KeV. In some embodiments, the PAI process 230 implants species at a dosage ranging in a range from about $1 \times 10^{14}$ atoms/cm$^2$ to about $2 \times 10^{15}$ atoms/cm$^2$, depending on the implantation temperature. Lower implantation temperature enhances implant amorphization efficiency. In some embodiments, the implant temperature is in a range from about −100° C. to about 25° C. (or room temperature).

In some embodiments, a patterned photoresist layer is utilized to define where the amorphized region 232 is formed and to protect other regions of the semiconductor device 200 from implantation damage. For example, the PMOS regions are protected. In some embodiments, the patterned photoresist layer exposes the source/drain regions, such that the source/drain regions are exposed to the PAI process 230 (forming amorphized region 232) while the gate structure 220 (and other portions of the semiconductor device 200) are protected from the PAI process 230. Alternatively, a patterned hard mask layer, such as a SiN or SiON layer, is utilized to define the amorphized region. The patterned photoresist layer or the patterned hard mask layer is part of the current manufacturing process, for example lightly-doped drains (LDD) or source/drain formation, thereby minimizing cost as no additional photoresist layer or hard mask is required for the PAI process 230. After the PAI process is performed, the photoresist on substrate 210 is removed.

Figure 6:
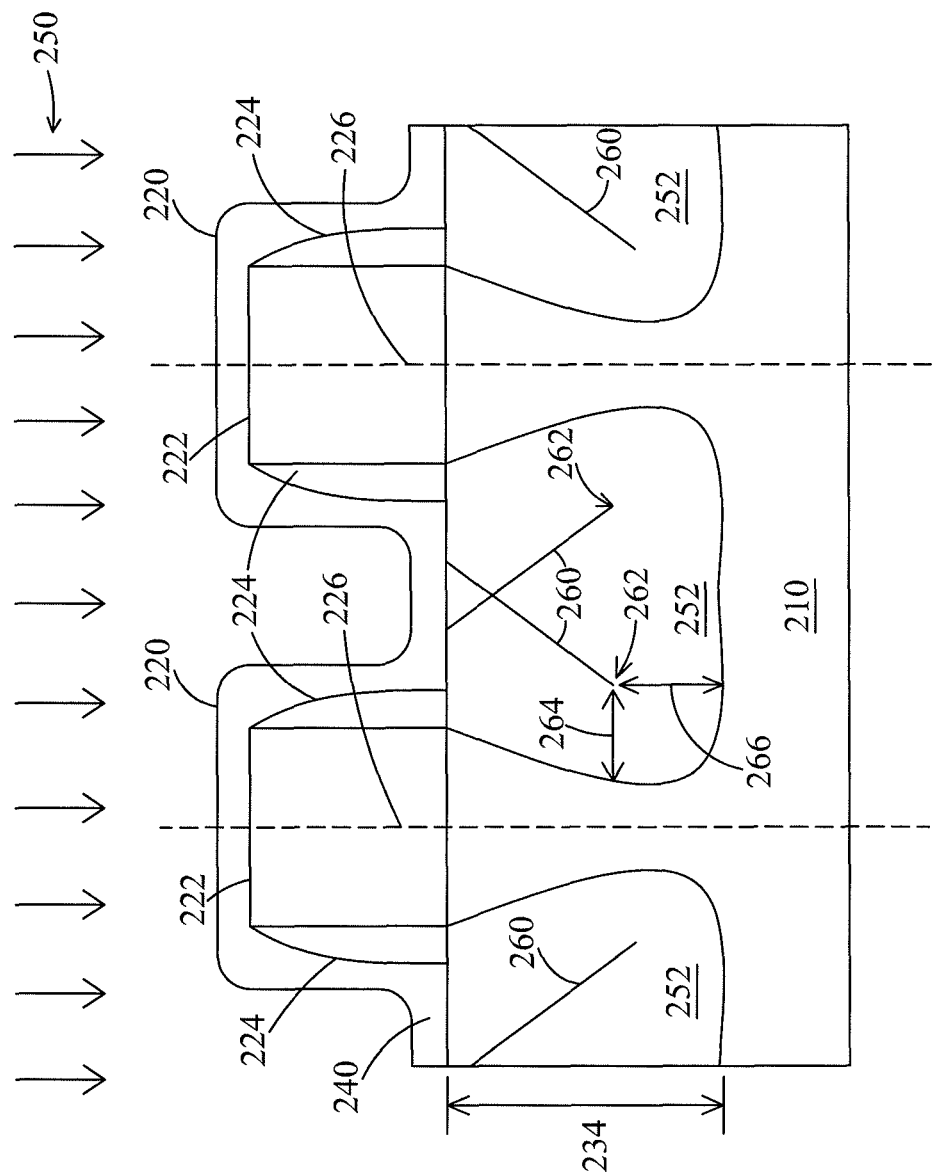

Referring to FIG. 6, a stress film 240 is deposited over the substrate 210. In some embodiments, the stress film 240 is formed by chemical vapor deposition (CVD), physical vapor deposition (PVD), atomic layer deposition (ALD), high density plasma CVD (HDPCVD), plating, other suitable methods, and/or combinations thereof. In some embodiments, the stress film 240 includes a dielectric material, such as silicon nitride, silicon oxide, silicon oxynitride, other suitable materials, and/or combinations thereof. The film 240 is used to provide stress in a subsequent annealing process 250 which recrystallizes the amorphized region 232. The stress film 240 has tensile stress, which affects the recrystallization process. For example, it could retard the growth rate in the [110] direction of the stressor regions 252. In some embodiments, the stress film 240 is not needed.

Still referring to FIG. 6, an annealing process 250 is performed on the substrate 210. The annealing process 250 causes the amorphized regions 232 to re-crystallize, forming stressor regions 252. This process is often referred to as solid-phase epitaxy (SPE), and thus, the stressor regions 252 is referred to as epi regions. The stressor regions 252 is, for example, epitaxial SiP stressor regions, epitaxial SiC, or SiCP stressor regions, in accordance with some embodiments. SiC stands for carbon-containing silicon and SiCP stands for carbon-and-phosphorous-containing silicon. In some embodiments, the carbon concentration is less than about 3 atomic %. In some embodiments, the P concentration is in a range from about 5E19 1/cm$^3$ to about 5E21 1/cm$^3$. In some embodiments, the P and/or C in silicon in the epitaxial stressor regions are implanted at previous operations. In some embodiments, carbon is implanted to silicon substrate to create SiC stressor, which is compressive and applies a tensile strain to the NMOS transistor channel region due to the small size of carbon (C) in comparison to silicon (Si). In addition, the compressive film stress in the stressor regions assists in the initiation of pinchoff. In some embodiments, P is doped to lower the resistance of the source and drain regions. In addition, carbon impedes the out-diffusion of P.

As described above, the annealing process 250 includes a rapid thermal annealing (RTA) process, a millisecond thermal annealing (MSA) process (for example, a millisecond laser thermal annealing process), or a micro-second thermal annealing (μSA) process. In some embodiments, other types of annealing processes are also used to anneal the substrate.

During the annealing process 250, as the substrate 210 recrystallizes, dislocations 260 are formed in the stressor region 252. In some embodiments, the dislocations 260 are formed in the [111] direction. In some embodiments, the [111] direction has an angle in a range from about 45 to about 65 degrees, the angle being measured with respect to an axis parallel to a surface of the substrate 210.

The dislocations 260 start formation at pinchoff points 262. In some embodiments, the pinchoff points 262 are formed in the stressor region 252 at a depth of about 10 to about 150 nanometers, the depth being measured from the surface of the substrate 210. The pinchoff points 262 have a horizontal buffer 264 and a vertical buffer 266. The horizontal buffer 264 and the vertical buffer 266 are formed according to design specifications and are affected by the annealing process 250. The pinchoff points 262 have a horizontal buffer 264 of about 5 to about 20 nanometers and a vertical buffer 266 of about 10 to about 40 nanometers, in some embodiments. In some embodiments, the pinchoff points 262 are formed such that the pinchoff points are not disposed within the channel region. As described above, the preheat process determines or controls the locations of the pinchoff points 262. In some embodiments, lower pinchoff points are used to ensure formation of pinchoff points and dislocations in recrystallized regions next to isolation structures, as discussed above.

Figure 7:
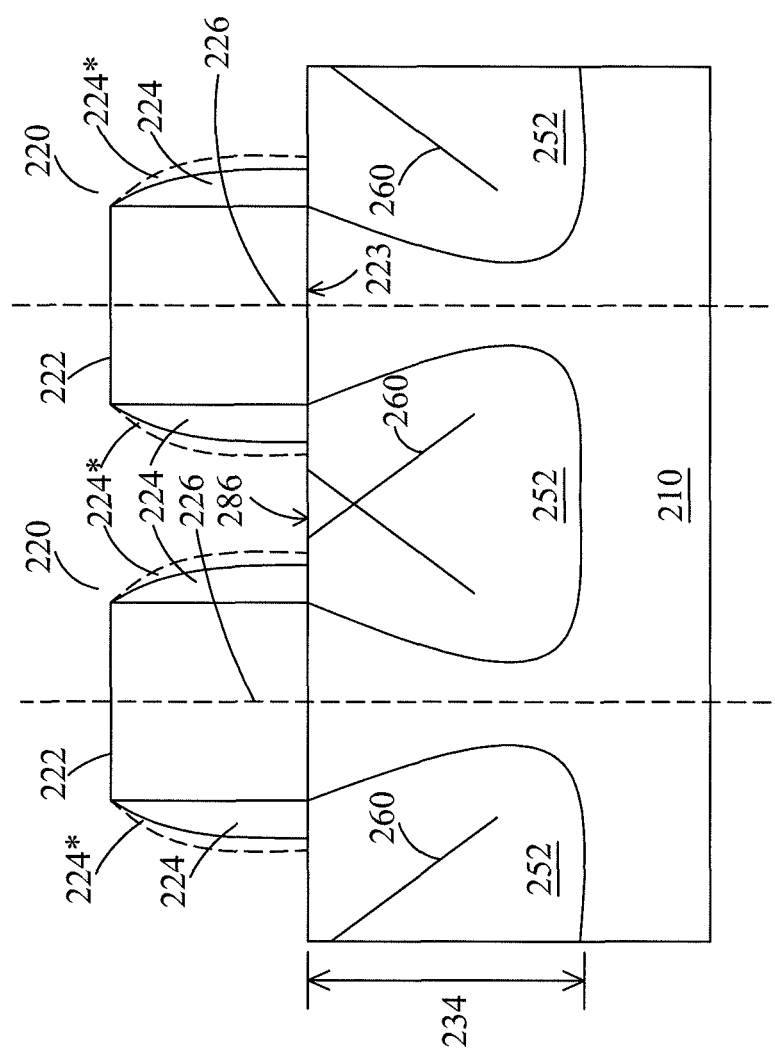

Referring to FIG. 7, the stress film 240 is removed from the substrate 210, if the stress film 240 has been deposited. As mentioned above, the stress film 240 is optional. In some embodiments, the gate spacers 224 are also removed from the gate structure 220. In some embodiments, the stress film 240 and optionally the gate spacers 224 are removed by an etching process. In some embodiments, the etching process is performed by wet etching, such as by using phosphoric acid or hydrofluoric acid, or by dry etching using suitable etchant. In some embodiments, the formation of spacers, PAI process, formation of stress film, annealing, and removal of stress film described above are repeated a number of times to create multiple dislocations. Further details of multiple dislocations in the stress regions 252 are in U.S. patent application Ser. No. 13/177,309, entitled "A Semiconductor Device with a Dislocation Structure and Method of Forming the Same" and filed on Jul. 6, 2011, which is incorporated herein by reference in its entirety.

After the stress film 240 is removed, optional dummy spacers 224* are formed on gate structure 220, in accordance with some embodiments. The dummy spacers 224* are used to define the distances of subsequently formed doped regions from the channel regions. The dummy spacers 224*, similar to gate spacers 224, are formed over the gate spacers 224 by any suitable process to any suitable thickness. In some embodiments, the dummy spacers 224* include a dielectric material, such as silicon nitride, silicon oxide, silicon oxynitride, other suitable materials, and/or combinations thereof.

Figure 8:
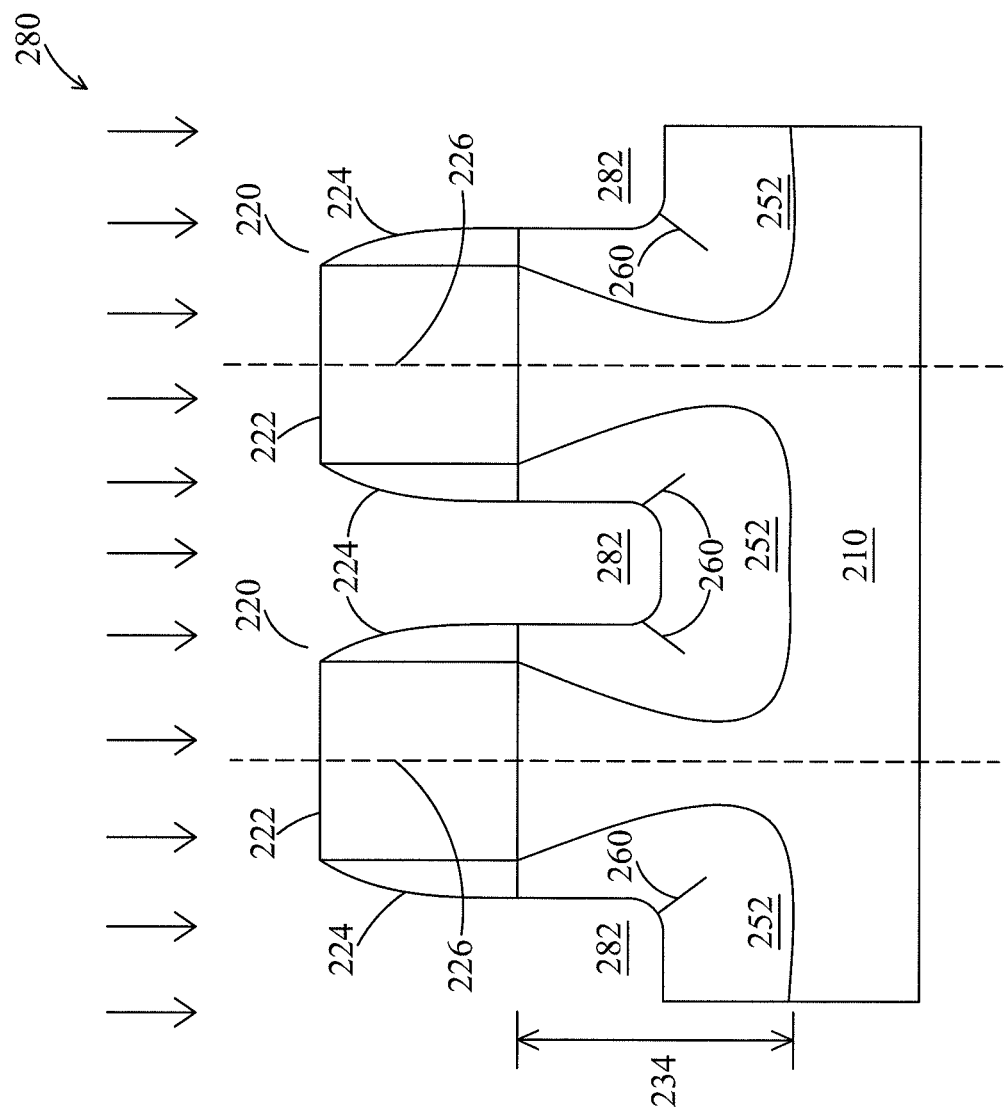

As described in FIG. 3, the formation of strain regions is completed for some embodiments after the annealing of the amorphized regions and the formation of dislocations are completed. In some other embodiments, additional processing is used to complete the formation of the strain regions. In some embodiments, recess regions 282 are formed on substrate 210, as shown in FIG. 8, in accordance with some embodiments. In some embodiments, a patterned photoresist layer is utilized to define where the recess regions 282 are formed and protect other regions of the semiconductor device 200 from implantation damage. For example, the PMOS regions are protected. In addition, the patterned photoresist layer exposes the source/drain regions, such that the source/drain regions are exposed to the etch process 280 (forming amorphized region 282) while the gate structure 220 (and other portions of the semiconductor device 200) are protected from the etch process 280. After the etch process 280 is performed, the photoresist on substrate 210 is removed.

Figure 9:
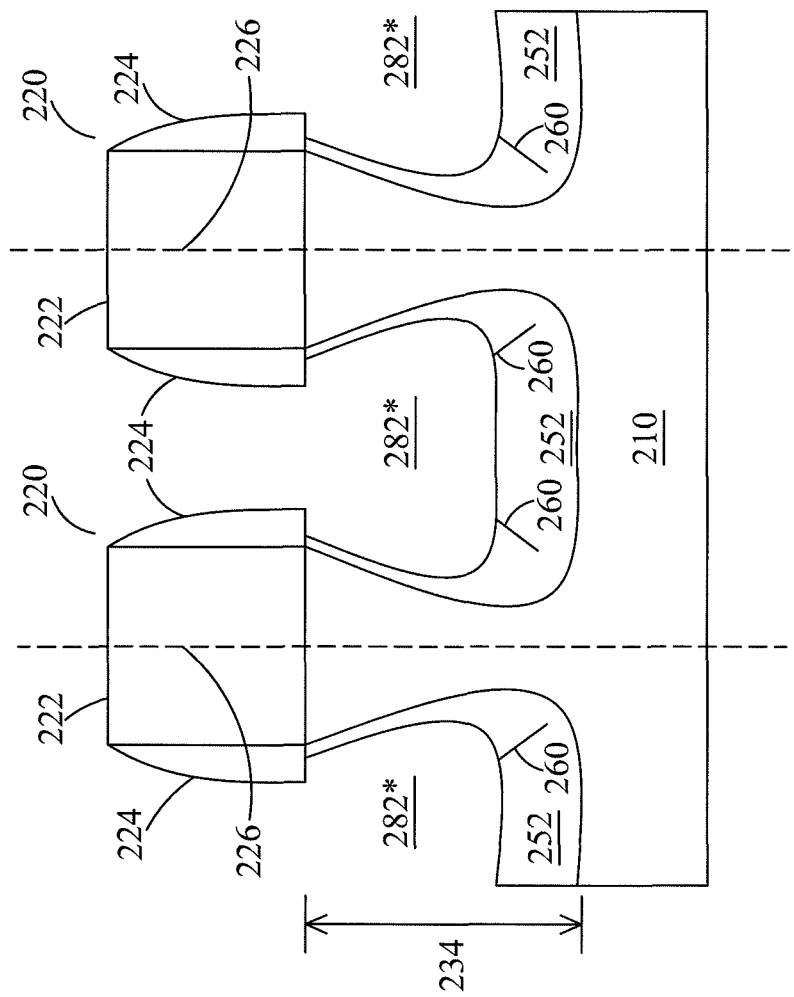

After the recess regions 282 are formed, substrate 210 undergoes a wet etch to form recess regions 282*, as shown in FIG. 9 in accordance with some embodiments. In some embodiments, the recess regions 282* have depths in a range from about 100 Å to about 800 Å. The widths of recess regions 282* near surface of substrate 210 are in a range from about 20 nm to about 200 nm. As mentioned above, in some embodiments, the widths of recess regions 282* extend under spacer 224, 224* (not shown in FIG. 7), or a combination thereof.

Figure 10:
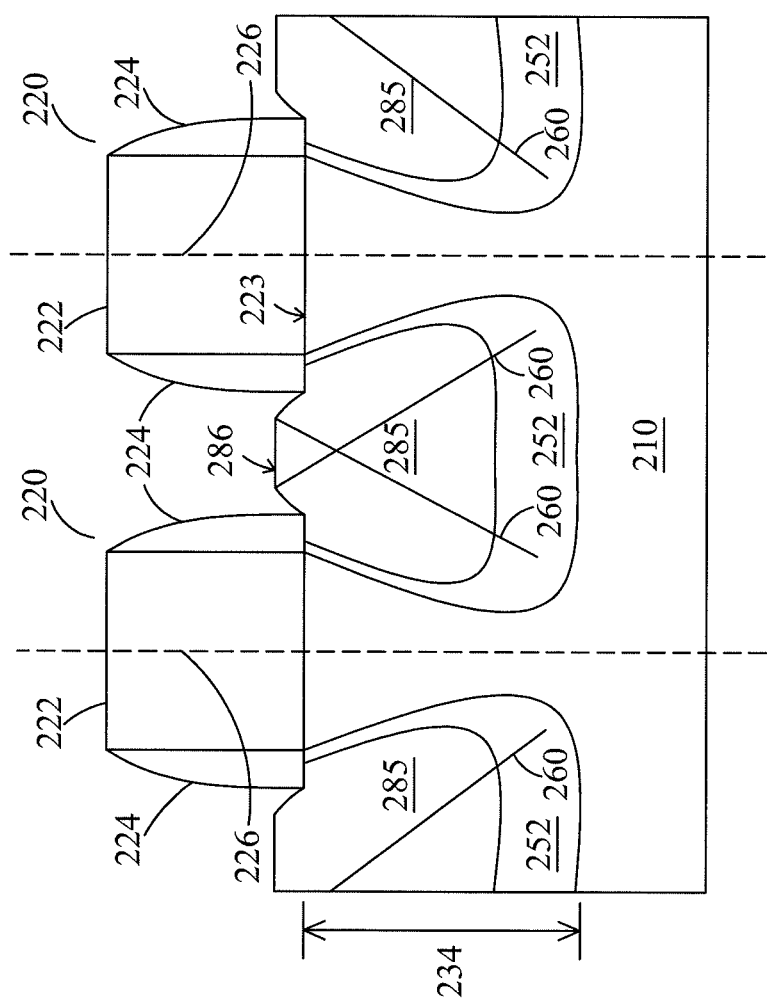

After forming etched recess regions 282*, a silicon-containing epitaxial structure 285 is formed in each of the recesses 282*, as shown in FIG. 10 in accordance with some embodiments. The silicon-containing structure 285 is formed by performing an epitaxial deposition process to form a silicon-containing epitaxial material, in some embodiments. In some embodiments, the silicon-containing epitaxial material includes SiC, SiCP, SiP or other material that produces tensile strain on the transistor channel region. In some embodiments, the silicon-containing material is formed by using a silicon-containing precursor. For example, gases, such as silane ($Si_{H4}$), disilane ($Si_{2H6}$), trisilane ($Si_{3H8}$), dichlorosilane ($Si_{H2}C_{l2}$), etc., are used to form SiC-containing epitaxial material in structure 285. In some embodiments, phosphorous-containing gas, such as phosphine ($P_{H3}$), is used to form SiP epitaxial material or to form SiCP with a carbon-containing gas. In other embodiments forming P-type transistors, the silicon-containing epitaxial material includes any material, such as SiGe, that produces compressive strain on the transistor channel region.

A surface 286 of the silicon-containing epitaxial structure 285 is level with or higher than a surface 223 (or the interface 223) of the substrate 210 and the gate structure 220. In some embodiments, the surface 223 has a height of up to about 300 Å above the substrate surface 223. Since the silicon-containing epitaxial structure 285 is also epitaxial, the dislocations 260 continue in structure 285, as shown in FIG. 10, in accordance with some embodiments.

In some embodiments, the silicon-containing epitaxial material is formed by chemical vapor deposition (CVD), e.g., low pressure CVD (LPCVD), atomic layer CVD (ALCVD), ultrahigh vacuum CVD (UHVCVD), reduced pressure CVD (RPCVD), any suitable CVD, molecular beam epitaxy (MBE) process, any suitable epitaxial process; or any combinations thereof. In some embodiments, the deposition of the silicon-containing epitaxial material have a deposition temperature of about 750° C. or less. In other embodiments, the etching temperature ranges from about 500° C. to about 750° C. In some embodiments, the pressure of the deposition process ranges from about 50 Torr to about 500 Torr.

Alternatively, the silicon-containing epitaxial material is formed by performing an epitaxial deposition process to form a silicon-containing epitaxial material. Details of such process are described in U.S. patent application Ser. No. 13/029,378, entitled "Integrated Circuits and Fabrication Methods Thereof" and filed on Feb. 17, 2011.

In some embodiments, the semiconductor device 200 undergoes further CMOS or MOS technology processing to form various features known in the art. For example, the method 170 may proceed to form main spacers. In some embodiments, contact features, such as silicide regions, are also formed. The contact features include silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. In some embodiments, the contact features are formed by a process that includes depositing a metal layer, annealing the metal layer such that the metal layer is able to react with silicon to form silicide, and then removing the non-reacted metal layer. In some embodiments, an inter-level dielectric (ILD) layer is further formed on the substrate 210 and a chemical mechanical polishing (CMP) process is further applied to the substrate to planarize the substrate. In some embodiments, a contact etch stop layer (CESL) is formed on top of the gate structure 220 before forming the ILD layer.

In an embodiment, the gate stack 222 remains polysilicon in the final device. In another embodiment, a gate replacement process (or gate last process) is performed, where the polysilicon gate stack 222 is replaced with a metal gate. For example, a metal gate may replace the gate stack (i.e., polysilicon gate stack) of the gate structure 220. The metal gate includes liner layers, work function layers, conductive layers, metal gate layers, fill layers, other suitable layers, and/or combinations thereof. The various layers include any suitable material, such as aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

In some embodiments, subsequent processing further forms various contacts/vias/lines and multilayer interconnect features (e.g., metal layers and interlayer dielectrics) on the substrate 210, configured to connect the various features or structures of the semiconductor device 200. The additional features provide electrical interconnection to the device. For example, a multilayer interconnection includes vertical interconnects, such as conventional vias or contacts, and horizontal interconnects, such as metal lines. The various interconnection features implement various conductive materials including copper, tungsten, and/or silicide. In one example, a damascene and/or dual damascene process is used to form a copper related multilayer interconnection structure.

The disclosed semiconductor device 200 is used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

The embodiments of processes and structures described above provide mechanisms for improving mobility of carriers. A dislocation is formed in a source or drain region between a gate structure or an isolation structure by first amortizing the source or drain region and then recrystallizing the region by using an annealing process with a low pre-heat temperature. A doped epitaxial material may be formed over the recrystallized region. The dislocation and the strain created by the doped epitaxial material in the source or drain region help increase carrier mobility. In some embodiments, the NMOS transistor performance is increased by about 10-25%.

One aspect of this description relates to a method of manufacturing a semiconductor device. The method performing a pre-amorphous implantation (PAI) process to form an amorphized region in a substrate having a gate stack thereon. The method also includes performing an annealing process to recrystallize the amorphized region after the stress film is formed. The annealing process includes a preheat at a temperature in a range from about 400° C. to about 550° C. and an annealing temperature equal to or greater than about 900° C., and the annealing process recrystallizes the amorphized region.

Another aspect of this description relates to a method of manufacturing a semiconductor device. The method includes performing a pre-amorphous implantation (PAI) process to form an amorphized region in a substrate having a gate stack thereon. The method also includes performing an annealing process to recrystallize the amorphized region after the stress film is formed. The annealing process includes a preheat at a temperature in a range from about 400° C. to about 550° C. and an annealing temperature equal to or greater than about 900° C., and the annealing process recrystallizes the amorphized region. The method further includes forming a recess region on the substrate, and the recess region overlies the recrystallized region. In addition, the method includes forming an epitaxial stress-inducing material in the recess region.

Still another aspect of this description relates to a method of manufacturing a semiconductor device. The method includes performing a pre-amorphous implantation (PAI) process to form an amorphized region in a substrate adjacent to a gate stack. The method further includes performing an annealing process to recrystallize the amorphized region to form a recrystallized region. The annealing process includes maintaining the substrate at a pre-heat temperature for a first duration; heating the substrate to a peak temperature greater than the first temperature; and cooling the substrate. The substrate has a heated temperature within 50° C. of the peak temperature for a second duration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
performing a pre-amorphous implantation (PAI) process to form an amorphized region in a substrate having a gate stack thereon; and
performing an annealing process to recrystallize the amorphized region to form a recrystallized region, wherein the annealing process includes a preheat at a temperature in a range from about 400° C. to about 750° C. and an annealing temperature equal to or greater than about 900° C.

2. The method of claim 1, wherein the recrystallized region includes a dislocation.

3. The method of claim 1, wherein performing the PAI process includes implanting the substrate with silicon (Si) or germanium (Ge) implant species.

4. The method of claim 1, wherein the annealing process includes a rapid thermal annealing (RTA) process, a millisecond thermal annealing (MSA) process, or a microsecond thermal annealing (OA) process.

5. The method of claim 1, further comprising:
forming a recess region on the substrate, wherein the recess region overlies the recrystallized region; and
forming an epitaxial stress-inducing material in the recess region.

6. The method of claim 5, wherein the epitaxial stress-inducing material includes SiC, SiP, or SiCP.

7. The method of claim 5, wherein the dislocation and the epitaxial stress-inducing material exert stress in the channel region under the gate stack.

8. The method of claim 1, further comprising:
forming a stress film over the substrate prior to performing the annealing process; and
removing the stress film after performing the annealing process.

9. The method of claim 1, wherein the amorphized region is next to an isolation structure.

10. A method of manufacturing a semiconductor device, the method comprising:
performing a pre-amorphous implantation (PAI) process to form an amorphized region in a substrate having a gate stack thereon;
performing an annealing process to recrystallize the amorphized region, wherein the annealing process includes a preheat at a temperature in a range from about 400° C. to about 750° C. and an annealing temperature equal to or greater than about 900° C.;
forming a recess region on the substrate, wherein the recess region overlies the recrystallized region; and
forming an epitaxial stress-inducing material in the recess region.

11. A method of manufacturing a semiconductor device, the method comprising:
performing a pre-amorphous implantation (PAI) process to form an amorphized region in a substrate adjacent to a gate stack; and
performing an annealing process to recrystallize the amorphized region to form a recrystallized region, wherein the annealing process comprises:
maintaining the substrate at a pre-heat temperature for a first duration;
heating the substrate to a peak temperature greater than the first temperature; and
cooling the substrate, wherein the substrate has a heated temperature within 50° C. of the peak temperature for a second duration.

12. The method of claim 11, wherein maintaining the substrate at the pre-heat temperature comprises maintaining the substrate at a temperature ranging from about 350° C. to about 750° C.

13. The method of claim 11, wherein maintaining the substrate at the pre-heat temperature comprises maintaining the substrate for the first duration ranging from about 1 second to about 120 seconds.

14. The method of claim 11, wherein performing the annealing process comprises heating the substrate to the heated temperature for the second duration ranging from about 0.5 seconds to about 5 seconds.

15. The method of claim 11, wherein maintaining the substrate at the pre-heat temperature comprises maintaining the substrate at a temperature ranging from about 200° C. to about 700° C.

16. The method of claim 11, wherein performing the annealing process comprises heating the substrate to the heated temperature for the second duration ranging from about 1 millisecond to about 100 milliseconds.

17. The method of claim 11, wherein maintaining the substrate at the pre-heat temperature comprises maintaining the substrate at a temperature ranging from about 400° C. to about 800° C.

18. The method of claim 11, wherein performing the annealing process further comprises maintaining the substrate at a second temperature less than the peak temperature for a third duration.

19. The method of claim 11, wherein performing the annealing process comprises heating the substrate to the heated temperature for the second duration ranging from about 1 microsecond to about 500 microseconds.

20. The method of claim 11, wherein performing the annealing process comprises selecting the pre-heat temperature based on a desired pinch-off of a dislocation in the recrystallized region.

* * * * *